(12) United States Patent
Yamazaki

(10) Patent No.: US 9,006,823 B2
(45) Date of Patent: Apr. 14, 2015

(54) SEMICONDUCTOR DEVICE AND METHOD OF MANUFACTURING SEMICONDUCTOR DEVICE

(71) Applicant: Shinya Yamazaki, Okazaki (JP)

(72) Inventor: Shinya Yamazaki, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/166,031

(22) Filed: Jan. 28, 2014

(65) Prior Publication Data

US 2014/0210001 A1    Jul. 31, 2014

(30) Foreign Application Priority Data

Jan. 31, 2013   (JP) .................................. 2013-016943

(51) Int. Cl.
H01L 29/78 (2006.01)
H01L 21/22 (2006.01)

(52) U.S. Cl.
CPC ............ *H01L 29/7827* (2013.01); *H01L 21/22* (2013.01)

(58) Field of Classification Search
USPC ........................................................ 257/330
See application file for complete search history.

(56) References Cited

U.S. PATENT DOCUMENTS

| 2008/0237704 A1* | 10/2008 | Williams et al. .............. 257/338 |
| 2010/0038711 A1* | 2/2010 | Hsieh ............................ 257/331 |
| 2014/0077290 A1* | 3/2014 | Hsieh ............................ 257/330 |

FOREIGN PATENT DOCUMENTS

| JP | 2001-274399 A | 10/2001 |
| JP | 2007-027440 A | 2/2007 |
| JP | 2008-171891 A | 7/2008 |
| JP | 2011-165971 A | 8/2011 |
| JP | 2012-064908 A | 3/2012 |

* cited by examiner

*Primary Examiner* — Zandra Smith
*Assistant Examiner* — Lawrence Tynes, Jr.
(74) *Attorney, Agent, or Firm* — Gifford, Krass, Sprinkle, Anderson & Citkowski, P.C.

(57) ABSTRACT

A semiconductor device includes: a semiconductor substrate formed with an element region; a first conductive type first region formed in the element region and located on a surface side of the semiconductor substrate; a second conductive type second region located in a deeper position than the first region in the element region and contacting the first region; a first conductive type third region located in a deeper position than the second region in the element region, contacting the second region, and separated from the first region by the second region; and a gate disposed in a trench extending from the surface to reach the third region, and contacting a range of the second region via the insulation film. A thickness of the second region in a depth direction is gradually increased from the peripheral part of the element region to the central part thereof

3 Claims, 21 Drawing Sheets

SEMICONDUCTOR DEVICE AND METHOD OF MANUFACTURING SEMICONDUCTOR DEVICE

INCORPORATION BY REFERENCE

The disclosure of Japanese Patent Application No. 2013-016943 filed on Jan. 31, 2013 including the specification, drawings and abstract is incorporated herein by reference in its entirety.

BACKGROUND OF THE INVENTION

1. Field of the Invention

The present invention relates to a semiconductor device and a method of manufacturing a semiconductor device.

2. Description of Related Art

In a semiconductor device that controls ON/OFF of current, when the current flows in a semiconductor substrate, a temperature thereof is increased by heat generation. The generated heat is hardly radiated from a central part of the semiconductor substrate when compared to a peripheral part of the semiconductor substrate, and thus the temperature is easily increased. In the semiconductor device disclosed in Japanese Patent Application Publication No. 2007-027440 (JP 2007-027440 A), an interval of operation cells in the central part of the semiconductor substrate is increased. Accordingly, a density of the operation cells formed in the central part is set to be lower than a density of the operation cells formed in the peripheral part of the semiconductor substrate. Therefore, a heat value per unit area of the central part in the semiconductor substrate is suppressed, and temperature distribution in the semiconductor substrate becomes uniform.

However, in a technique disclosed in JP 2007-027440 A, if the interval of the operation cells in the central part is increased without reducing the number of the operation cells formed in the semiconductor substrate, a physical size of the semiconductor substrate is increased.

SUMMARY OF THE INVENTION

The present invention provides a semiconductor device and a method of manufacturing a semiconductor device that can uniform temperature distribution in the semiconductor device while suppressing an increase in physical size of the semiconductor device.

A first aspect of the present invention relates to the semiconductor device. The semiconductor device includes: a semiconductor substrate formed with the element region; a first conductive type first region that is formed in the element region and located on a surface side of the semiconductor substrate; a second conductive type second region that is located in a deeper position than the first region in the element region and contacts the first region; a first conductive type third region that is located in a deeper position than the second region in the element region, contacts the second region, and is separated from the first region by the second region; and a gate that is disposed in a trench extending from the surface of the semiconductor substrate to reach the third region and contacts the second region in a range that separates the first region from the third region via an the insulation film. A thickness of the second region in a depth direction is gradually increased from a peripheral part of the element region to a central part of the element region.

In the above aspect, the thickness of the second region in the depth direction is gradually increased from the peripheral part of the element region to the central part. Accordingly, current flowing through the element region of the semiconductor device can gradually be reduced from the peripheral part of the element region to the central part. As a result, a heat value of the element region can gradually be reduced from the peripheral part of the element region to the central part. Thus, temperature distribution in the semiconductor device can be uniform. In addition, because the heat value is adjusted by simply changing the thickness of the second region in the depth direction, it is possible to suppress an increase in physical size of the semiconductor device.

A second aspect of the present invention relates to a method of manufacturing the above semiconductor device. The method of manufacturing includes: forming a resist mask having plural openings that are disposed at intervals from each other in a surface of the semiconductor substrate; and introducing a second conductive impurity into a depth where the second region of the semiconductor substrate is formed in a range that is exposed from the plural openings after formation of the resist mask. An area of each of the openings of the resist mask is gradually increased from the peripheral part of the element region to the central part.

In the above aspect, by changing the area of each of the openings of the resist mask, the thickness of the second region in the depth direction can gradually be increased from the peripheral part to the central part of the element region. Because only the area of each of the openings of the resist mask has to be changed, the above semiconductor device can be manufactured without adding any special step when compared to other techniques.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
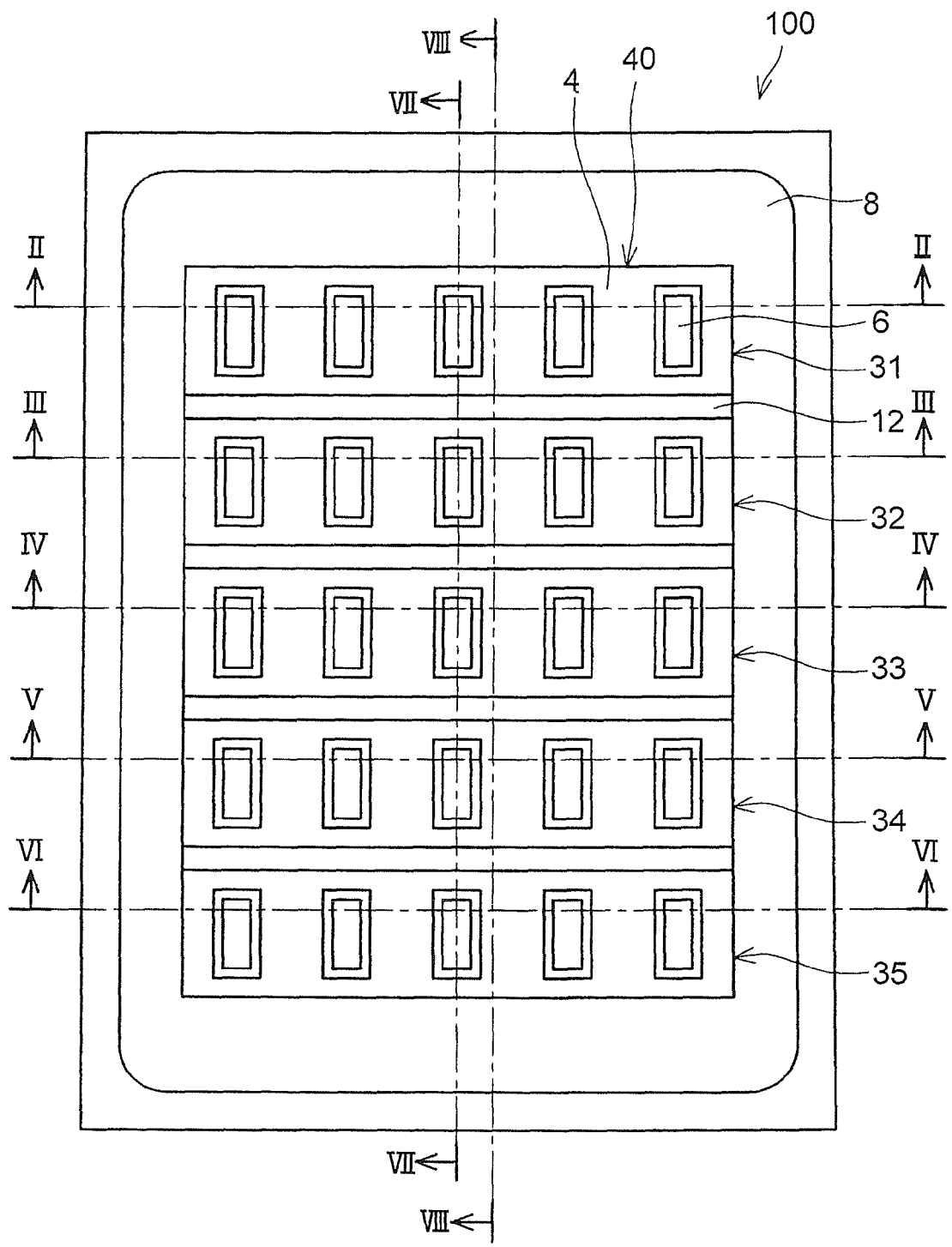
FIG. 1 is a plan view of a semiconductor device 100 according to an embodiment of the present invention.
Figure 2:
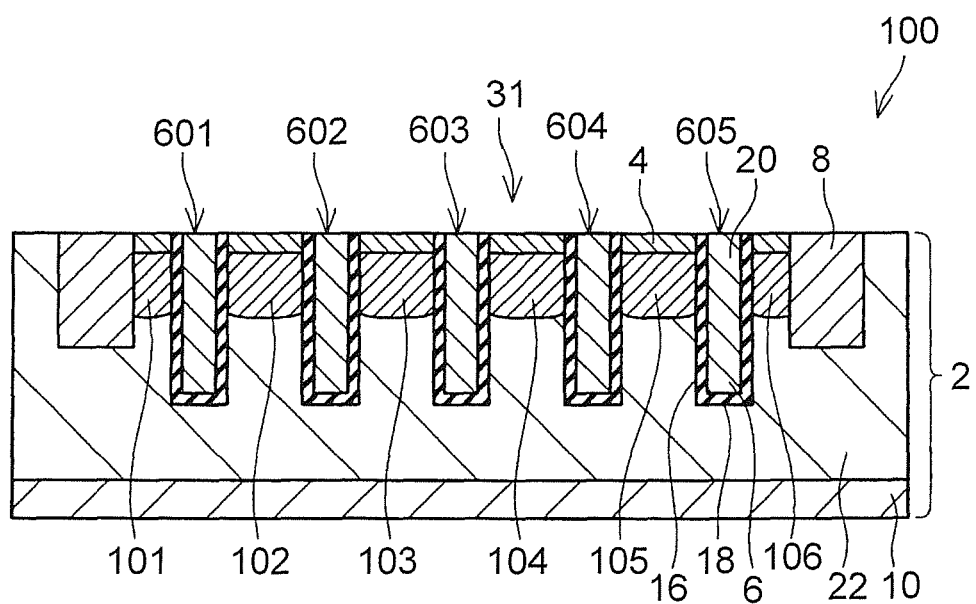
FIG. 2 is a cross-sectional view taken along a II-II cross section of the semiconductor device 100 according to the embodiment of the present invention.
Figure 3:
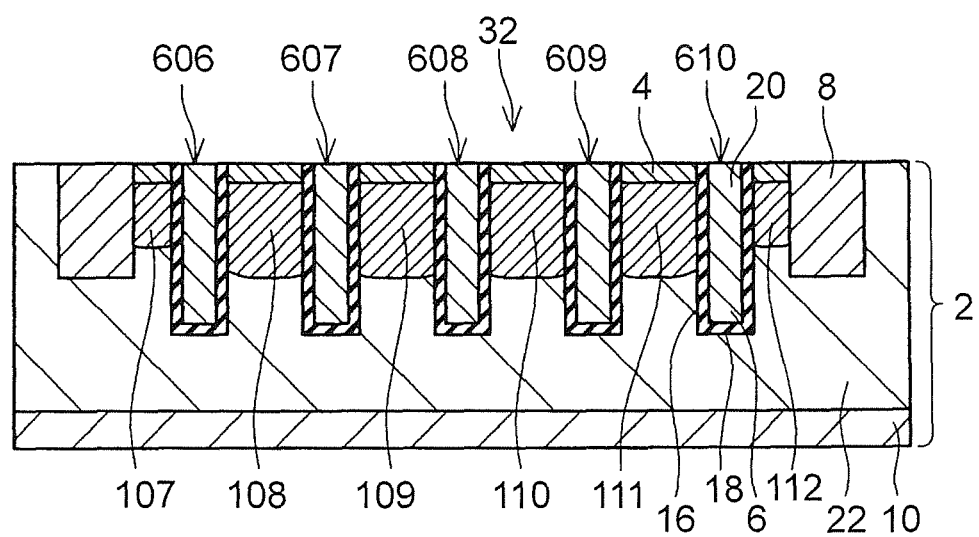
FIG. 3 is a cross-sectional view taken along a cross section of the semiconductor device 100 according to the embodiment of the present invention.
Figure 4:
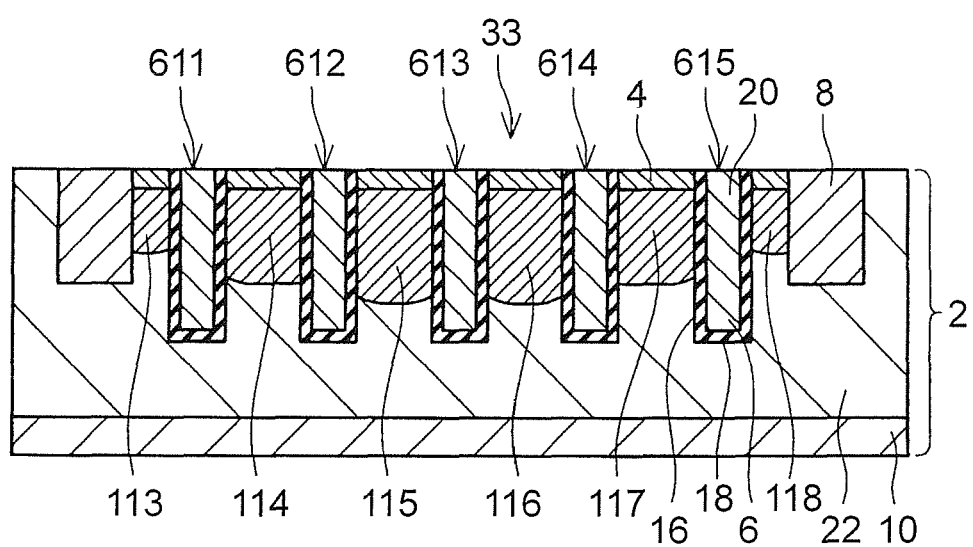
FIG. 4 is a cross-sectional view taken along a IV-IV cross section of the semiconductor device 100 according to the embodiment of the present invention.
Figure 5:
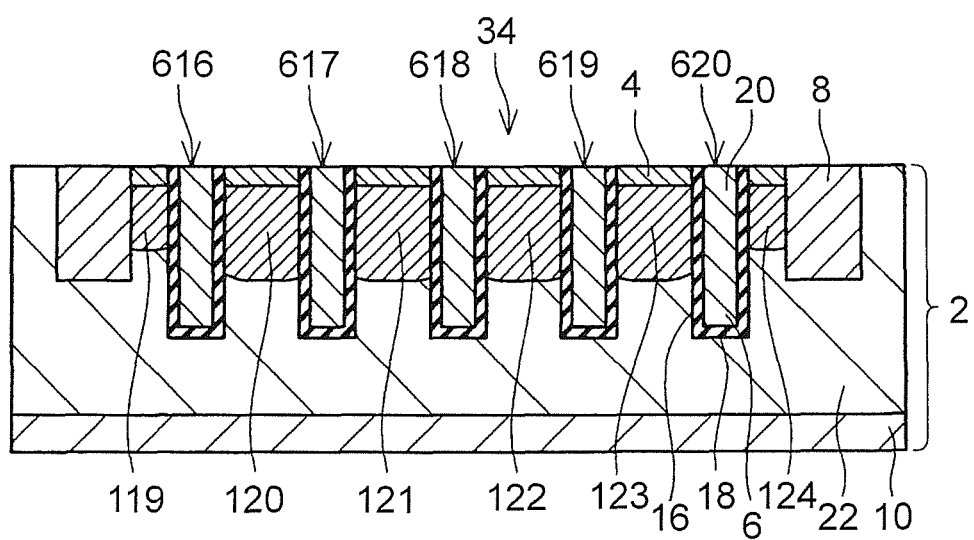
FIG. 5 is a cross-sectional view taken along a V-V cross section of the semiconductor device 100 according to the embodiment of the present invention.
Figure 6:
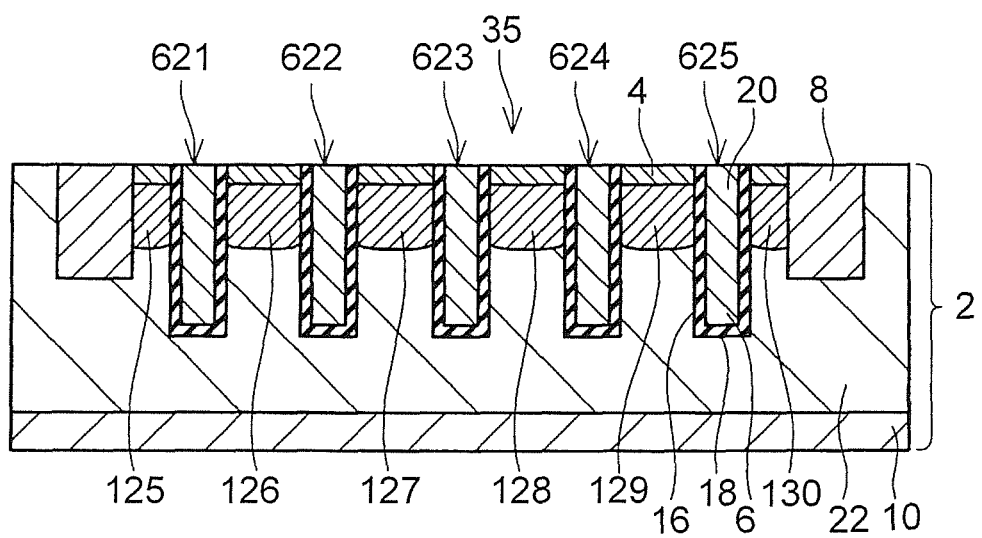
FIG. 6 is a cross-sectional view taken along a VI-VI cross section of the semiconductor device 100 according to the embodiment of the present invention.
Figure 7:
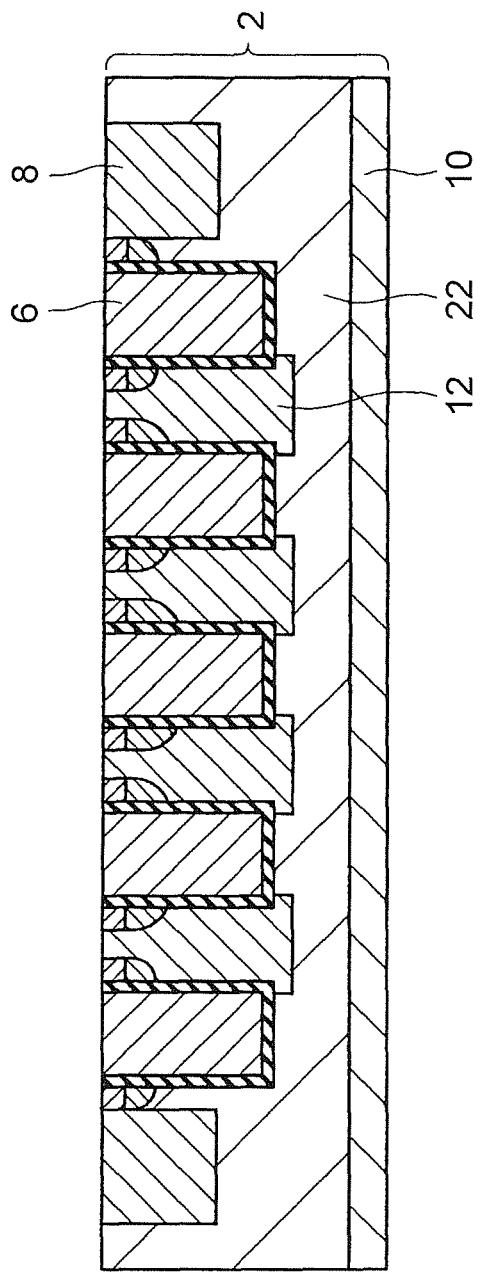
FIG. 7 is a cross-sectional view taken along a VII-VII cross section of the semiconductor device 100 according to the embodiment of the present invention.

A description will hereinafter be made on some of elements of an embodiment that is disclosed herein. It should be noted that each of the items described below demonstrates technical utility by itself.

Plural trenches may be formed in an element region of a semiconductor device disclosed herein. When a semiconductor substrate is seen in a plan view, the plural trenches may be disposed at intervals in a first direction and extend in a second direction that is orthogonal to the first direction. A gate is disposed in each of the trenches, and a thickness of a second region in a depth direction that contacts the trench in a cross section that is parallel to the first direction and is orthogonal to a surface of the semiconductor substrate may gradually be increased from a peripheral part of the element region to a central part of the element region.

In the above semiconductor device, current flowing through the element region of the semiconductor device can gradually be reduced from the peripheral part of the element region to the central part thereof in the cross section that is parallel to the first direction and is orthogonal to the surface of the semiconductor substrate. In other words, temperature distribution in the semiconductor substrate can be uniform in a direction orthogonal to a direction that the gate extends.

In the semiconductor device disclosed herein, the thickness of the second region in the depth direction may gradually be increased from the peripheral part of the element region to the central part of the element region in a cross section that is parallel to the second direction and is orthogonal to the surface of the semiconductor substrate.

In the above semiconductor device, the current flowing through the element region of the semiconductor device may gradually be lowered from the peripheral part of the element region to the central part thereof in the cross section that is parallel to the second direction and is orthogonal to the surface of the semiconductor substrate. In other words, the temperature distribution in the semiconductor substrate can be uniform in a direction parallel to the direction in which the gate extends.

The element region may have plural element parts that are disposed at intervals in the second direction when seen in the plan view. Each of the element parts may include a first region, the second region, a third region, and the gate. In the cross section that is parallel to the second direction and is orthogonal to the surface of the semiconductor substrate, the thickness of the second region in the depth direction that contacts the trench in each of the element parts may gradually be increased from the element part located in the peripheral part of the element region to the element part located in the central part of the element region.

In the above semiconductor device, the current flowing through the element region can gradually be lowered from the peripheral part of the element region to the central part thereof by changing the thickness of the second region in the depth direction in each of the element parts.

A method of manufacturing a semiconductor device disclosed herein may further include a first conductive impurity introducing step in which a first conductive impurity is introduced into a depth where the first region of the semiconductor substrate is formed in a range in which the first region is exposed from plural openings after a resist mask forming step.

In the above method of manufacturing a semiconductor device, the resist mask is used to introduce the first conductive impurity. In addition, the same resist mask as that used for introducing the first conductive impurity is used to introduce a second conductive impurity. Thus, there is no necessity to provide the resist mask only for a purpose of introducing the second conductive impurity. Therefore, it is possible to suppress an increase in manufacturing cost of the semiconductor device.

A description will hereinafter be made on a structure of the semiconductor device 100 with reference to FIG. 1 to FIG. 8. The semiconductor device 100 includes a semiconductor substrate 2 as well as an electrode and an insulation film that are formed on a front surface and a back surface of the semiconductor substrate 2 (not shown in FIG. 1 to FIG. 8). The semiconductor substrate 2 is formed with an element region 40. In FIG. 1, the element region 40 is a region that is located on the inner side of a field limiting ring 8. (The field limiting ring 8 will be described below.) The element region 40 includes plural element parts 31 to 35. In FIG. 1, the element parts 31 to 35 each has a laterally long rectangular shape and are disposed to align in a up-and-down direction of FIG. 1. The element part 31 includes plural operation cells 601 to 605. Similarly, the element part 32 includes plural operation cells 606 to 610, the element part 33 includes the plural operation cells 611 to 615, the element part 34 includes plural operation cells 616 to 620, and the element part 35 includes plural operation cells 621 to 625. Each of the operation cells 601 to 625 constitutes a so-called IGBT. In other words, each of the operation cells 601 to 625 has a gate 6, an emitter region 4, a body contact region (not shown), one of body regions 101 to 130, a drift region 22, and a collector region 10.

A surface of the semiconductor substrate 2 has an emitter electrode (not shown) that is connected to the emitter region 4 and a body contact region of each of the operation cells 601 to 625. In addition, the back surface of the semiconductor substrate 2 has a collector electrode (not shown) that is connected to the collector region 10. Furthermore, the front surface of the semiconductor substrate 2 includes a gate pad (not shown) that is connected to the gate 6 of each of the operation cells 601 to 625.

When an ON voltage is applied to a gate electrode in a state in which a voltage is applied between the emitter electrode and the collector electrode of the semiconductor device 100 such that a potential of the collector electrode is higher than a potential of the emitter electrode, the current flows between the emitter electrode and the collector electrode. In addition, when the application of the ON voltage to the gate electrode is stopped in a state in which the current flows between the emitter electrode and the collector electrode, the current flowing between the emitter electrode and the collector electrode is cut off.

It should be noted that the body contact region is not shown in FIG. 1 to FIG. 8 as described above. That is, FIG. 1 to FIG. 8 show a state after the emitter region 4 and the body regions 101 to 130, which will be described below, are formed and before the body contact region is formed.

A description will next be made on the detailed structure of the semiconductor device 100 with reference to FIG. 1 to FIG. 8. The semiconductor substrate 2 is specifically a SiC substrate. However, the semiconductor substrate 2 may be a Si substrate, for example. The emitter region 4 of an n-type semiconductor is formed in a position that is exposed to an upper surface of the semiconductor substrate 2. The emitter electrode (not shown) described above is connected to each of the emitter regions 4. The body regions 101 to 130 of a p-type semiconductor are formed in positions that are deeper than the emitter regions 4 (positions on the lower side in FIG. 2 to FIG. 8). Each of the body regions 101 to 130 contacts the emitter region 4.

In addition, the body contact region (not shown) that is the p-type semiconductor is formed in the semiconductor substrate 2. In FIG. 2 to FIG. 8, the body contact region is formed in a part of a section that is formed with each of the emitter regions 4. The body contact region is formed for each of the emitter regions 4. Concentration of a p-type impurity that is introduced in the body contact region is higher than concentration of the p-type impurity that is introduced in the body regions 101 to 130. The body contact region contacts the body regions 101 to 130, and the body regions 101 to 130 are connected to the emitter electrode via the body contact region.

The drift region 22 that is an n-type semiconductor is formed in a position that is deeper than the body regions 101 to 130. The body regions 101 to 130 separate the emitter region 4 from the drift region 22. The body regions 101 to 130 contact the drift region 22. The collector region 10 that is the p-type semiconductor is provided on a lower side of the drift region 22 (lower end of the semiconductor substrate 2). The drift region 22 contacts the collector region 10.

Plural trenches 16 are formed on the upper surface of the semiconductor substrate 2, and the gate 6 formed in each of the trenches 16. The trench 16 penetrates the emitter region 4 and each of the body regions 101 to 130 from the upper surface of the semiconductor substrate 2 and reaches the drift region 22. An inner side of the trench 16 is covered with a gate insulation film 18. The gate insulation film 18 is filled with polysilicon 20. The gate 6 is a rectangle in the plan view (FIG. 1). The gates 6 are formed in five lateral rows and five longitudinal rows. Each of the gates 6 is connected to the gate pad by an unillustrated gate line. A range that faces the upper surface of the semiconductor substrate 2 is formed with the field limiting ring 8. The field limiting ring 8 is formed in a substantially rectangular frame shape in the plan view (FIG. 1) and is disposed to surround the element region 40. The field limiting ring 8 is a p-type semiconductor with lower concentration than the body regions 101 to 130. The field limiting ring 8 serves as a so-called peripheral region of the element region 40.

Figure 8:
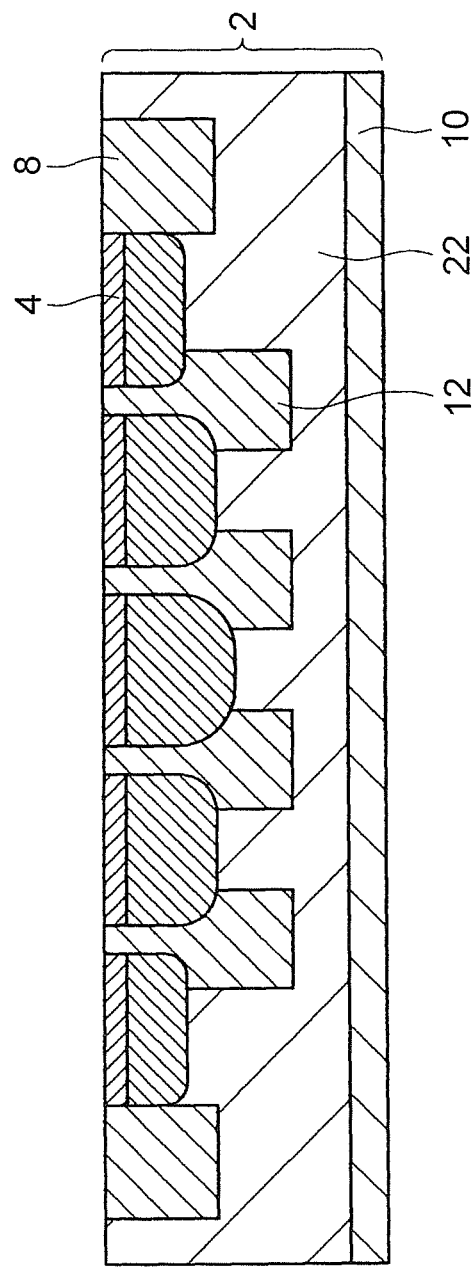
FIG. 8 is a cross-sectional view taken along a VIII-VIII cross section of the semiconductor device 100 according to the embodiment of the present invention.

As shown in FIG. 2 to FIG. 6, the body regions 101 to 130 that are adjacent to each other in a left-right direction of FIG. 1 are separated by the gates 6. In addition, as shown in FIG. 1 and FIG. 8, the body regions 101 to 130 that are adjacent to each other in the up-and-down direction of FIG. 1 are separated by p⁻ layers 12. In other words, the element parts 31 to 35 that are adjacent to each other in the up-and-down direction of FIG. 1 are separated by the p⁻ layers 12. The p⁻ layer 12 is a p-type semiconductor with lower concentration than the body regions 101 to 130. As shown in FIG. 2 to FIG. 6, the thicknesses in an up-and-down direction of the emitter regions 4 that are formed in the semiconductor substrate 2 are all the same. It should be noted that a periphery of each of the body regions 101 to 130 is surrounded by a region constituted by the field limiting ring 8 and the p⁻ layer 12 when seen in the plan view (FIG. 1). The region constituted by the field limiting ring 8 and the p⁻ layer 12 serves as a so-called peripheral region of each of the body regions 101 to 130.

As shown in FIG. 2 to FIG. 6, thicknesses in the up-and-down direction of the body regions 101 to 107, 112, 113, 118, 119, 124, 125 to 130 that are located in the peripheral part of the semiconductor device 100 (in FIG. 1) (that is, the thickness of the semiconductor substrate 2 in the depth direction) are the smallest among the body regions of the semiconductor device 100. The thicknesses in the up-and-down direction of the body regions 108 to 111, 114, 117, 120 to 123 that are located on the inner side of the body regions 101 to 107, 112, 113, 118, 119, 124, 125 to 130 are larger than the thicknesses in the up-and-down direction of the body regions 101 to 107, 112, 113, 118, 119, 124, 125 to 130. In addition, thicknesses in the up-and-down direction of the body regions 115, 116 that are located on the inner side of the body regions 108 to 111, 114, 117, 120 to 123 (that is, at the center of the semiconductor device 100) are further larger than the thicknesses in the up-and-down direction of the body regions 108 to 111, 114, 117, 120 to 123. In other words, in the semiconductor device 100 of this embodiment, the thickness of the body region in the up-and-down direction is gradually increased from the peripheral part to the central part of the semiconductor device 100.

A detailed description will be made on a state that the semiconductor device 100 is ON. When the ON voltage is applied to the gate electrode, the ON voltage is also applied to the gate 6 of each of the operation cells 601 to 625. Accordingly, a channel is formed in each of the body regions 101 to 130 that faces each of the gates 6 via the gate insulation film 18.

As described above, the thickness of the body region in the up-and-down direction is gradually increased from the peripheral part to the central part of the semiconductor device 100. Thus, a channel length of the channel that is formed in the body region is gradually increased from the peripheral part to the central part of the semiconductor device 100. When the ON voltage of a certain magnitude is applied to each of the gates 6, an amount of the current that flows through the operation cell with the long channel is small while an amount of the current that flows through the operation cell with the short channel is large.

In other words, in the semiconductor device 100 of this embodiment, the current that flows through each of the operation cells of the semiconductor device 100 when the semiconductor device 100 is turned ON is gradually reduced from the peripheral part to the central part of the semiconductor device 100. As a result, a heat value of each of the operation cells of the semiconductor device 100 is gradually reduced from the peripheral part to the central part of the semiconductor device 100. Accordingly, the temperature distribution in the semiconductor device 100 can be uniform. By uniforming the temperature distribution in the semiconductor device 100, the current flowing through the semiconductor device 100 can be increased. As shown in FIG. 2 to FIG. 6, the intervals of the gates 6 (the intervals in the horizontal direction of FIG. 1) do not differ between the peripheral part and the central part of the semiconductor device 100. Therefore, even when the temperature distribution in the semiconductor device 100 is uniformed, it is possible to suppress the increase in the physical size of the semiconductor device 100.

In addition, in the semiconductor device 100 of this embodiment, the channel lengths of the operation cells that are located in the peripheral part of the semiconductor device 100 are set to be short. Accordingly, a gate capacity of each of such operation cells is reduced. Thus, switching loss of each of such operation cells is reduced. As a result, the switching loss of the semiconductor device 100 can be reduced.

It should be noted that the heat generation is reduced by the reduction in switching loss of the semiconductor device 100. This can also increase the current flowing through the semiconductor device 100.

A description will be made on a method of manufacturing the semiconductor device 100 of this embodiment. First, an n-type impurity is introduced to the entire semiconductor substrate 2. For example, phosphorus (P) can be used as the n-type impurity. The introduction of the n-type impurity can be conducted by a known method. Next, the p$^-$ layer 12 is formed. The formation of the p$^-$ layer 12 can be conducted by a known method.

Figure 9:
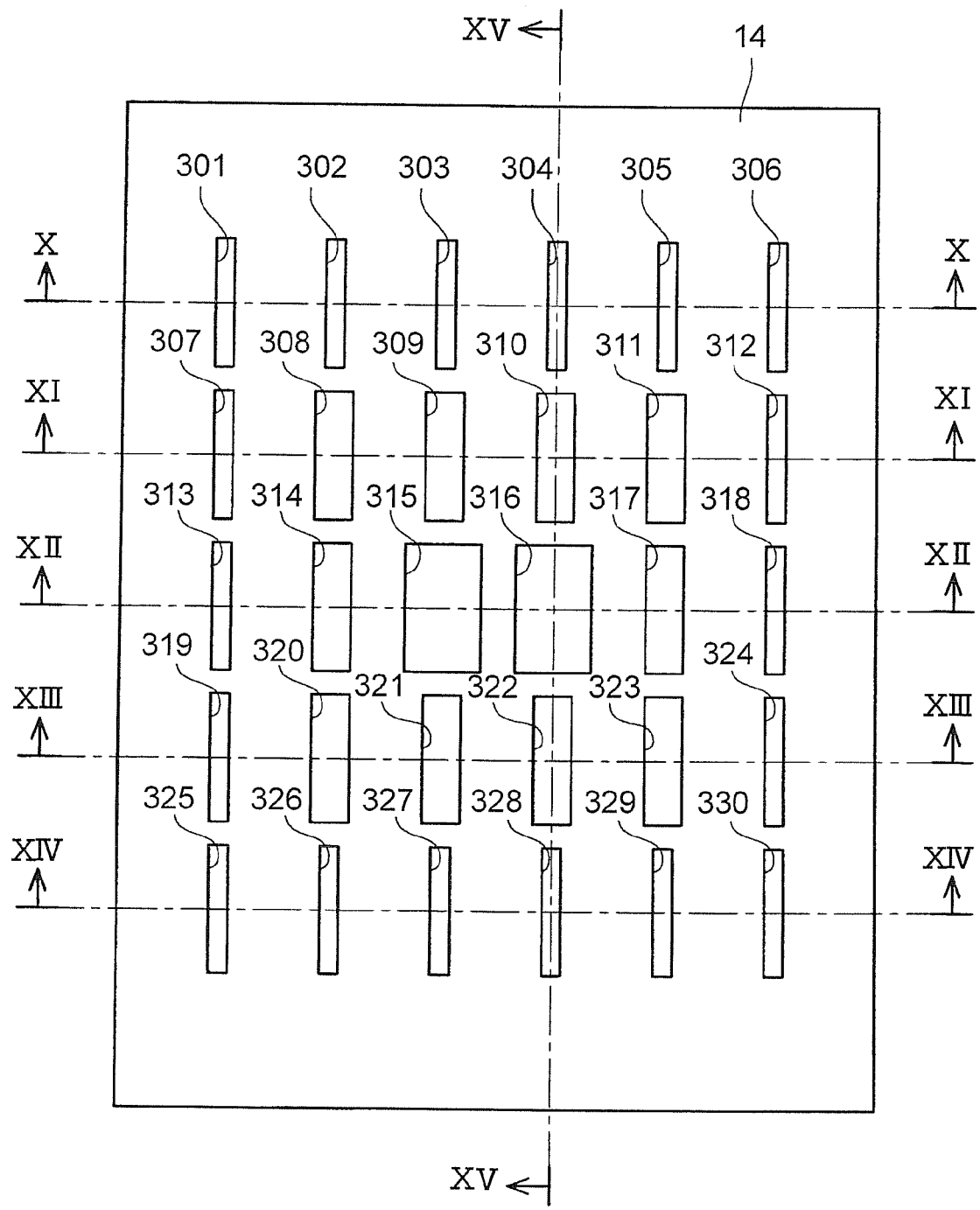
FIG. 9 is a plan view for showing manufacturing steps of the semiconductor device 100 according to the embodiment of the present invention.
Figure 10:
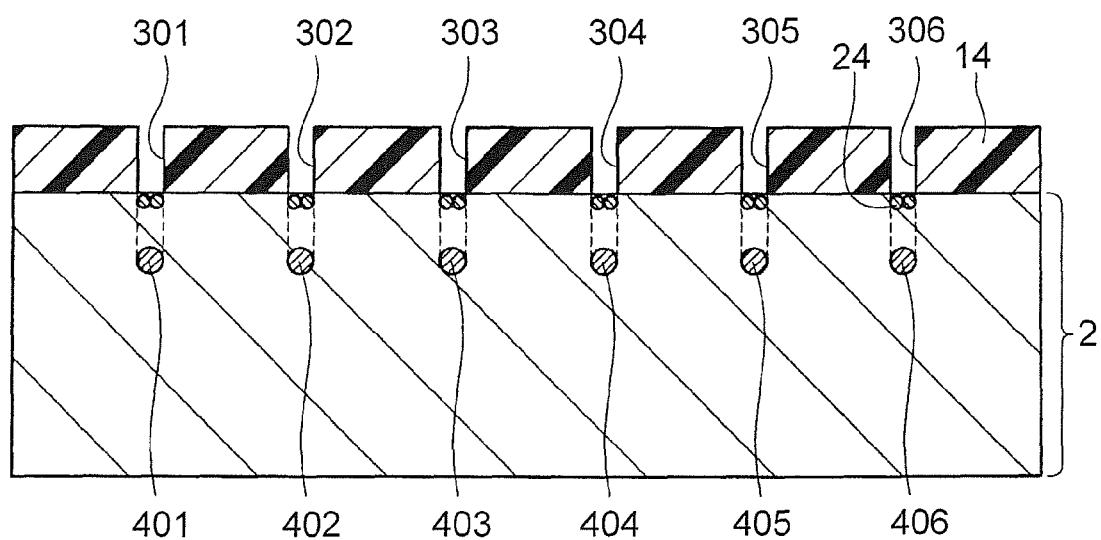
FIG. 10 is a cross-sectional view taken along an X-X cross section in FIG. 9.
Figure 11:
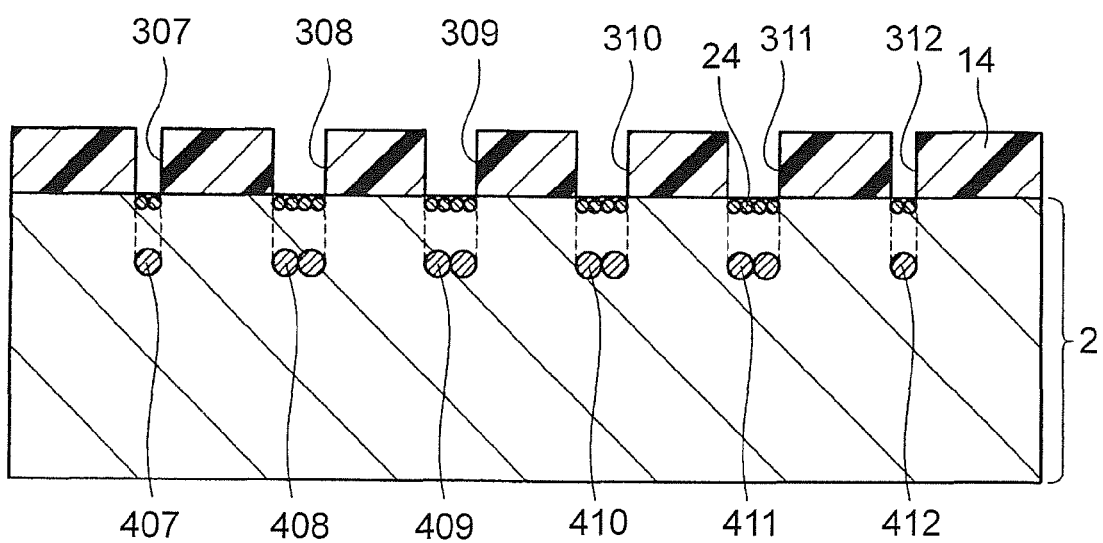
FIG. 11 is a cross-sectional view taken along an XI-XI cross section in FIG. 9.
Figure 12:
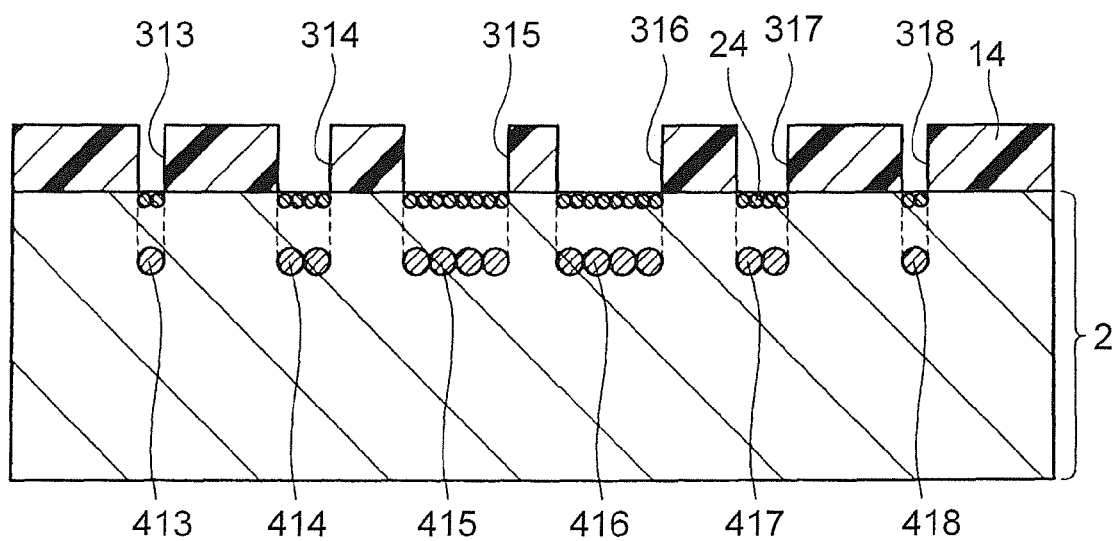
FIG. 12 is a cross-sectional view taken along an XII-XII cross section in FIG. 9.
Figure 13:
FIG. 13 is a cross-sectional view taken along an XIII-XIII cross section in FIG. 9.
Figure 14:
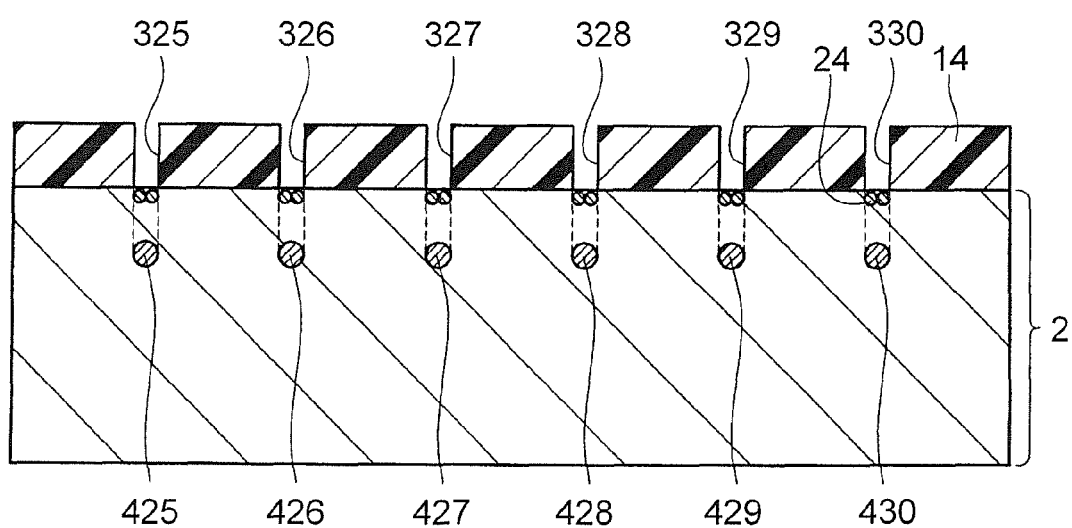
FIG. 14 is a cross-sectional view taken along an XIV-XIV cross section in FIG. 9.
Figure 15:
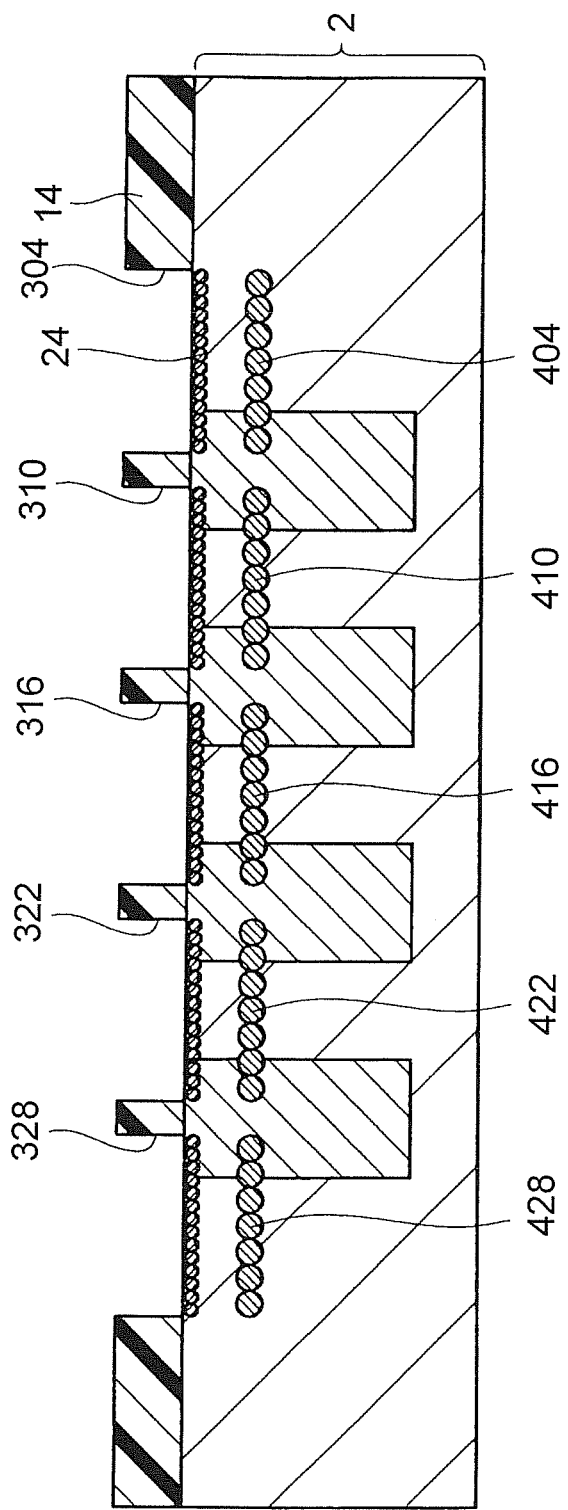
FIG. 15 is a cross-sectional view taken along an XV-XV cross section in FIG. 9.
Figure 16:
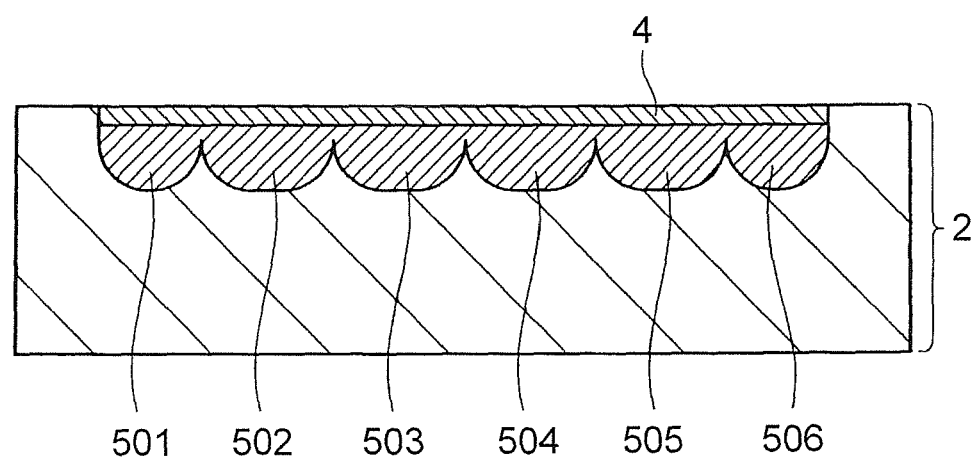
FIG. 16 is a cross-sectional view for showing a state after heat treatment of the cross section in FIG. 10.
Figure 17:
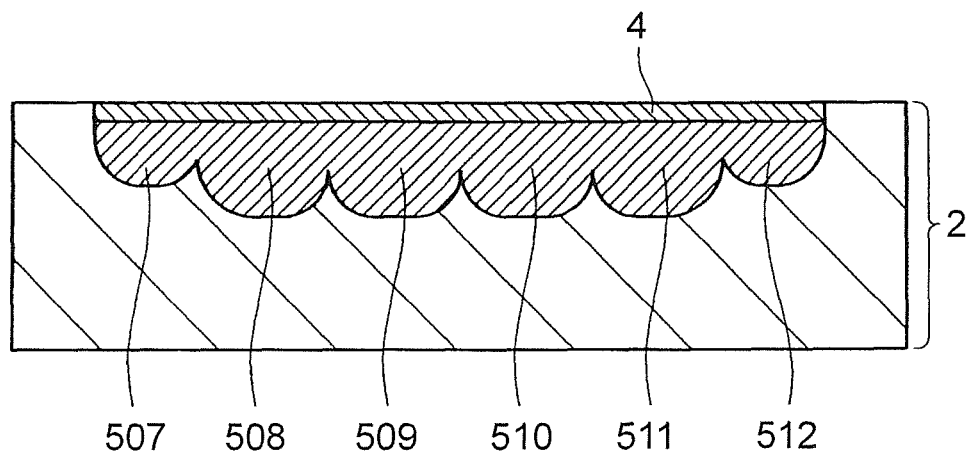
FIG. 17 is a cross-sectional view for showing a state after heat treatment of the cross section in FIG. 11.
Figure 18:
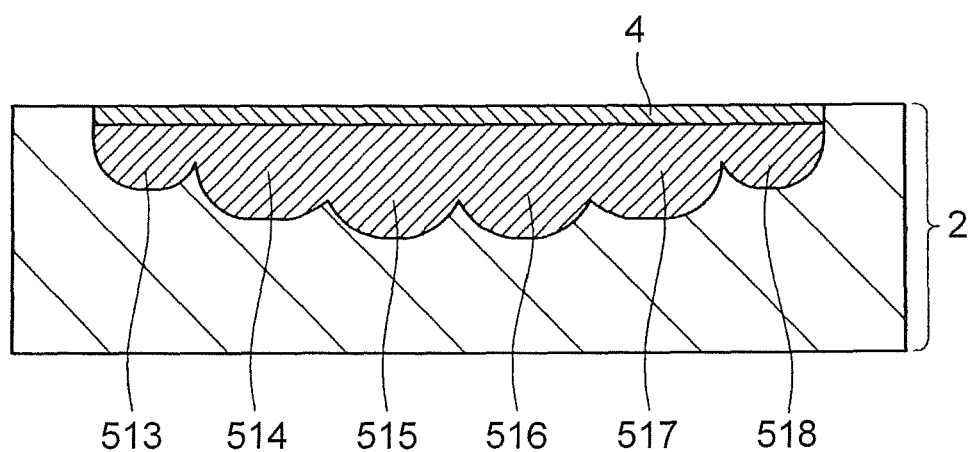
FIG. 18 is a cross-sectional view for showing a state after heat treatment of the cross section in FIG. 12.
Figure 19:
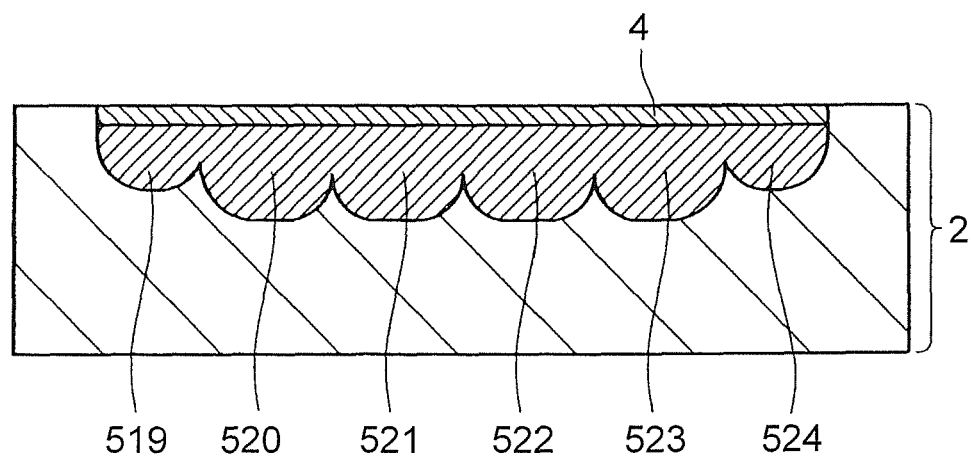
FIG. 19 is a cross-sectional view for showing a state after heat treatment of the cross section in FIG. 13.
Figure 20:
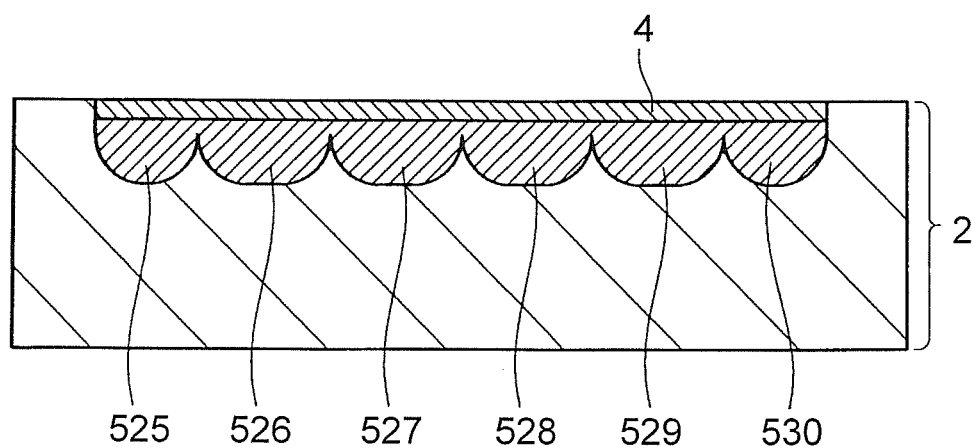
FIG. 20 is a cross-sectional view for showing a state after heat treatment of the cross section in FIG. 14.
Figure 21:
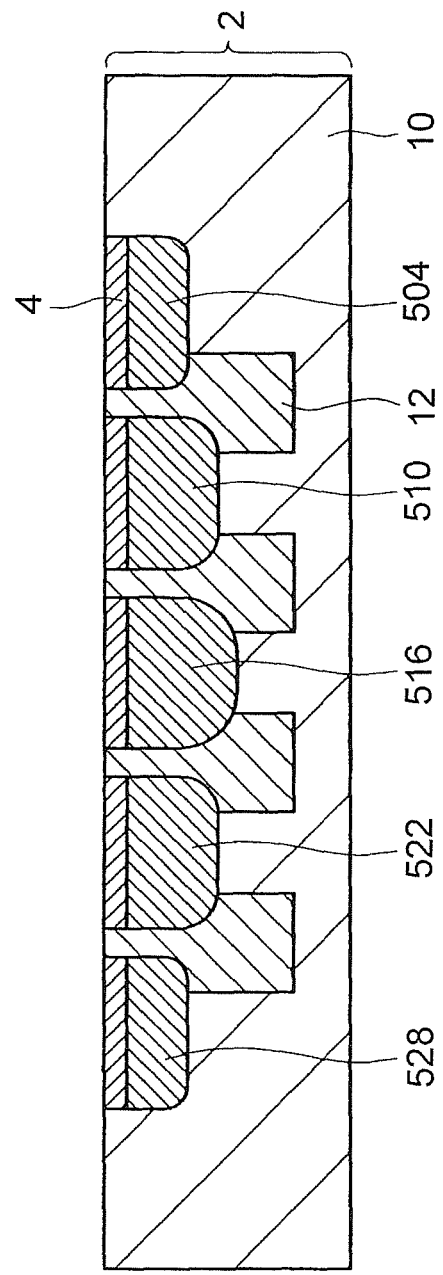
FIG. 21 is a cross-sectional view for showing a state after heat treatment of the cross section in FIG. 15.

Next, the emitter region 4 and the body regions 101 to 130 are formed. First, as shown in FIG. 9 to FIG. 15, a resist mask 14 is formed on the upper surface of the semiconductor substrate 2. The resist mask 14 has openings 301 to 330. As shown in FIG. 9, the openings are formed in six rows in the left-and-right direction and five rows in the up-and-down direction. Each of the openings 301 to 330 is a rectangle that is long in the up-and-down direction. Each of the openings 301 to 330 has a same length in the up-and-down direction.

As shown in FIG. 9, the openings 301 to 307, 312, 313, 318, 319, 324, 325 to 330 that are located in the peripheral part of the resist mask 14 have the smallest width in the left-and-right direction. In other words, areas of the openings 301 to 307, 312, 313, 318, 319, 324, 325 to 330 (opening areas) are the smallest among all the openings. Similarly, areas of the openings 308 to 311, 314, 317, 320 to 323 that are located on the inner side (in FIG. 9) of the openings 301 to 307, 312, 313, 318, 319, 324, 325 to 330 are larger than the areas of the openings 301 to 307, 312, 313, 318, 319, 324, 325 to 330. Areas of the openings 315, 316 that are further located on the inner side of the openings 308 to 311, 314, 317, 320 to 323 (that is, at the center of the semiconductor device 100) are larger than the areas of the openings 308 to 311, 314, 317, 320 to 323. In other words, the area of the opening is gradually increased from the peripheral part to the central part of the semiconductor device 100.

After the resist mask 14 is formed, an n-type impurity 24 is introduced into the range of the semiconductor substrate 2 that is exposed to the inner side of each of the openings 301 to 330. For example, phosphorus (P) can be used as the n-type impurity 24. The introduction of the n-type impurity 24 can be conducted by an ion implantation method, for example. The n-type impurity 24 is introduced in a position that is near the upper surface of the semiconductor substrate 2.

Next, the p-type impurities 401 to 430 are introduced into the range of the semiconductor substrate 2 that is exposed to the inner side of each of the openings 301 to 330. For example, boron (B) can be used as the p-type impurities 401 to 430. The introduction of the p-type impurities 401 to 430 can be conducted by the ion implantation method, for example. As shown in FIG. 10 to FIG. 15, the p-type impurities 401 to 430 are introduced into positions that are deeper than the above n-type impurity 24. In addition, an amount of each of the p-type impurities 401 to 430 that is introduced into each of the openings 301 to 330 is larger than an amount of the n-type impurity 24 that is introduced into the opening.

It should be noted that the amount of each of the p-type impurities 401 to 430 that is introduced into each of the openings 301 to 330 is increased with an increase in the area of the opening. As described above, the area of the opening is gradually increased from the peripheral part to the central part of the semiconductor device 100. Accordingly, the introduced amount of each of the p-type impurities 401 to 430 is gradually increased from the peripheral part to the central part of the semiconductor device 100.

Next, the semiconductor substrate 2 is heat-treated. The n-type impurity 24 is activated and diffused by heat treatment. The emitter region 4 is formed by diffusion of the n-type impurity 24.

In addition, the p-type impurity is activated and diffused by the heat treatment. Accordingly, p-type impurity regions 501 to 530 are formed (FIG. 16 to FIG. 21). A depth at a lower end of each of the p-type impurity regions 501 to 530 that are formed in the semiconductor substrate 2 is increased with an increase in the amount of the p-type impurity that is introduced into the semiconductor substrate 2. Accordingly, the depth at the lower end of each of the p-type impurity regions 501 to 530 is gradually increased from the peripheral part to the central part of the semiconductor device 100.

It should be noted that, as described above, the amount of each of the p-type impurities 401 to 430 that is introduced from each of the openings 301 to 330 is larger than the amount of the n-type impurity 24 that is introduced from the opening thereof. Accordingly, the amount of each of the p-type impurities 401 to 430 that is introduced from each of the openings 301 to 330 and whose depth is increased by the diffusion is larger than the amount of the n-type impurity 24 that is introduced from the opening and whose depth is increased by the diffusion. Thus, a distance between the lower end of each of the p-type impurity regions 501 to 530 that is formed in each of the openings 301 to 330 and an lower end of the emitter region 4 that is formed in the opening (that is, thickness of the body region in the up-and-down direction) is gradually increased from the peripheral part to the central part of the semiconductor device 100.

Next, the body contact region (not shown) is formed in the upper surface of the semiconductor substrate 2. The body contact region is formed for each of the body regions 101 to 130. The body contact region is formed by introducing the p-type impurity into a part of the emitter region 4 that corresponds to each of the body regions 101 to 130. The introduction of the p-type impurity into each of the emitter regions 4 is conducted by a known method. The concentration of the p-type impurity that is introduced into each of the body contact regions is higher than the concentration of the p-type impurity that is introduced into each of the body regions 101 to 130. By the formation of the body contact region, each of the body regions 101 to 130 and the emitter electrode are connected to each other by the body contact region.

Next, the gate 6 is formed in the upper surface of the semiconductor substrate 2. In order to form the gate 6, first, the trench 16 is formed in the upper surface of the semiconductor substrate 2. The trench 16 is formed to penetrate the emitter region 4 and each of the p-type impurity regions 501 to 530 from the upper surface of the semiconductor substrate 2 and reach the drift region 22. Next, the gate insulation film 18 is formed to cover the inner side of the trench 16. Then, the gate insulation film 18 is filled with the polysilicon 20. Accordingly, the gate 6 is formed. A portion of each of the p-type impurity regions 501 to 530 becomes each of the body regions 101 to 130 by forming the emitter region 4 and the gate 6 in the semiconductor substrate 2. The thicknesses of the body regions 101 to 130 in the depth direction is gradually increased from the peripheral part to the central part of the semiconductor device 100.

Next, the field limiting ring 8 is formed. The formation of the field limiting ring 8 can be conducted by a known method.

It should be noted that, because the body regions 101 to 130, the emitter region 4, the field limiting ring 8, and the p⁻ layer 12 are formed in the semiconductor substrate 2, a portion of the semiconductor substrate 2 that is not formed with these components (portion in the lower side of the semiconductor substrate 2) becomes the drift region 22. Next, the collector region 10 of the p-type semiconductor is formed on a lower surface of the semiconductor substrate 2 (lower surface of the drift region 22) by a known method. Furthermore, the emitter electrode is formed in the upper surface of the semiconductor substrate 2, and the collector electrode is formed on the lower surface of the semiconductor substrate 2 by a known method. Accordingly, the semiconductor device 100 is completed and becomes in the states shown in FIG. 1 to FIG. 8.

In the method of manufacturing the semiconductor device 100 of this embodiment, the thickness of the body region in each of the operation cells 601 to 625 of the semiconductor device 100 can gradually be increased from the peripheral part to the central part of the semiconductor device 100 by implanting the ion with use of the resist mask 14 that changes the areas of the openings 301 to 330. Therefore, any special step does not have to be conducted to change the thickness of the body region in each of the operation cells 601 to 625, and the body region can be formed in the same step that is used in a known method.

In the method of manufacturing the semiconductor device 100 of this embodiment, the n-type impurity 24 is introduced by using the resist mask 14. In addition, the same resist mask 14 as the resist mask 14 that introduces the n-type impurity 24 is used to introduce the p-type impurity regions 501 to 530. Accordingly, there is no need of providing the resist mask only for a purpose of introducing the p-type impurity regions 501 to 530. Therefore, it is possible to suppress the increase in the manufacturing cost of the semiconductor device 100.

It should be noted that the thicknesses of the body regions 101 to 130 of the semiconductor device 100 may gradually be increased from the peripheral part to the central part such that a line that connects vertices at the lower ends of the body regions 101 to 130 becomes a linear line. The thicknesses of the body regions 101 to 130 of the semiconductor device 100 may gradually be increased from the peripheral part to the central part such that a line that connects the vertices at the lower ends of the body regions 101 to 130 makes an arbitral curve (curve that is projected downward, for example).

The element region 40 of the above embodiment has the element parts 31 to 35. For example, the element region 40 may only have the one element part. The one element part, for example, may connect the element parts 31 to 35 to each other by removing the p⁻ layer 12 that separates the element parts 31 to 35 from each other. Also in this case, the thickness of the body region in the depth direction can gradually be increased from the peripheral part of the element region to the central part of the element region in the up-and-down direction of FIG. 1. Furthermore, in this case, the number of operation cells that are formed in the element region 40 in the left-and-right direction of FIG. 1 is not limited. For example, the element region 40 may be formed with the one operation cell in the left-and-right direction of FIG. 1. In addition, the gates 6 may be formed such that the gates 6 adjacent to each other in the up-and-down direction of FIG. 1 are aligned with each other. In this case, for example, all the gates of the element parts 31 to 35 may be connected to each other in the up-and-down direction.

In the above embodiment, the thicknesses of the body regions 101 to 130 are changed in both the up-and-down direction and the left-and-right direction of FIG. 1. However, a direction to change the thicknesses of the body regions 101 to 130 may be either one of the up-and-down direction and the left-and-right direction. Furthermore, the direction to change the thicknesses of the body regions 101 to 130 may be any direction that is parallel to a page of FIG. 1.

In the above embodiment, each of the openings 301 to 330 is the rectangle. However, each of the openings 301 to 330 may be in any shape. For example, right and left contour lines (FIG. 9) of each of the openings 301 to 330 may be gentle curves. The right and left contour lines of the openings 301 to 330 that are adjacent to each other in the up-and-down direction may make a large curve as a whole.

In the above embodiment, each of the operation cells 601 to 625 constitutes the IGBT. However, each of the operation cells 601 to 625 may constitute a MOSFET.

In the above embodiment, the upper surface of the semiconductor substrate 2 is formed with the resist mask 14. However, the upper surface of the semiconductor substrate 2 may be formed with a SiO₂ mask. In addition, another structure that contains Si may be used for the upper surface of the semiconductor substrate 2.

The correspondence between the above embodiment and claims will be described. The emitter region 4 corresponds to one example of a "first region" in claims, the body regions 101 to 130 correspond to one example of a "second region" in claims, and the drift region 22 corresponds to one example of the "third region" in claims.

A description has been made so far on the embodiment of the present invention; however, it is merely illustrative and thus does not limit the scope of claims. The techniques described in claims include various modifications and changes of the above illustrative embodiment. In addition, the technical elements that are described in this specification and the drawings demonstrate technical utility when used singly or in various combinations. The techniques that are illustrated in this specification and the drawings achieve a plurality of objects simultaneously, and the achievement of one object thereof itself has technical utility.

What is claimed is:
1. A semiconductor device comprising:
  a semiconductor substrate formed with an element region;
  a first conductive type first region that is formed in the element region and located on a surface side of the semiconductor substrate;
  a second conductive type second region that is located in a deeper position than the first region in the element region and contacts the first region;
  a first conductive type third region that is located in a deeper position than the second region in the element region, contacts the second region, and is separated from the first region by the second region; and
  a gate that is disposed in a trench extending from the surface of the semiconductor substrate to reach the third region and contacts a range of the second region that separates the first region from the third region via an insulation film, wherein
  a thickness of the second region in a depth direction is gradually increased from a peripheral part of the element region to a central part of the element region.

2. A method of manufacturing the semiconductor device according to claim 1, comprising:
    forming a resist mask having plural openings that are disposed at intervals from each other in a surface of the semiconductor substrate; and
    introducing a second conductive impurity into a depth for forming a range of the semiconductor substrate's second region that is exposed from the plural openings after formation of the resist mask, wherein
    an area of each of the openings of the resist mask is gradually increased from the peripheral part of the element region to the central part.

3. The method of manufacturing the semiconductor device according to claim 2 further comprising:
    introducing a first conductive impurity to a depth for forming a range of the semiconductor substrate's first region that is exposed from the plural openings after the formation of the resist mask.

\* \* \* \* \*